(12) United States Patent
Tada

(10) Patent No.: US 7,158,036 B2
(45) Date of Patent: Jan. 2, 2007

(54) RFID TAG INSPECTION SYSTEM

(75) Inventor: Nobuyuki Tada, Odawara (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 131 days.

(21) Appl. No.: 11/007,221

(22) Filed: Dec. 9, 2004

(65) Prior Publication Data
US 2005/0159906 A1    Jul. 21, 2005

(30) Foreign Application Priority Data
Jan. 19, 2004   (JP) .............................. 2004-011006

(51) Int. Cl.
G08B 13/14    (2006.01)
(52) U.S. Cl. ............................. 340/572.4; 340/572.5; 340/572.7
(58) Field of Classification Search ............ 340/572.1, 340/572.4, 572.5, 572.6, 572.7, 551, 10.3, 340/10.41, 10.42, 10.6; 235/492, 493
See application file for complete search history.

(56) References Cited

U.S. PATENT DOCUMENTS 5,821,859 A * 10/1998 Schrott et al. ........... 340/572.6
6,696,952 B1 * 2/2004 Zirbes ..................... 340/572.1
6,784,789 B1   8/2004 Eroglu et al.
6,806,812 B1 * 10/2004 Cathey ..................... 340/572.7
6,869,021 B1 * 3/2005 Foth et al. ................. 235/492

FOREIGN PATENT DOCUMENTS

JP    2002-230510 A    8/2002

* cited by examiner

Primary Examiner—Van T. Trieu
(74) Attorney, Agent, or Firm—Sughrue Mion, PLLC

(57) ABSTRACT

An RFID tag inspection system inspects the properties of tag antennas, and further, determines the communication performance of RFID tags, based on how much their resonant frequencies are shifted from a target value. The RFID tag inspection system includes: a reader/writer including a coiled reader/writer antenna, for transmitting/receiving data to or from the RFID tag at the resonant frequency through the reader/writer antenna; an RFID tag set portion on which the RFID tag is set in such a way that the tag antenna is located within a coverage area of the reader/writer antenna; and a magnetic field sensing coil including at least one open terminal, the magnetic field sensing coil being placed corresponding to the tag antenna.

20 Claims, 6 Drawing Sheets

RFID TAG INSPECTION SYSTEM

BACKGROUND OF THE INVENTION

1. Field of the Invention

An apparatus consistent with the present invention relates to an inspection system for RFID tags and, more specifically, to an inspection system which determines the communication performance of RFID tags, based on how much their resonant frequencies are shifted from a target value.

2. Description of the Related Art

In recent years, RFID (radio frequency identification) tags have been widely used in distribution systems and entering and leaving control systems, etc. An RFID tag has a memory in its integrated circuit (IC). This memory responds data from a reader/writer and, then transmits/receives data to or from the reader/writer in a non-contact manner. This transmission/reception is performed through respective coiled antennas provided in both an RFID tag and a reader/writer. Hereinafter, the coiled antenna of the RFID tag is referred to as "tag antenna", and the coiled antenna of the reader/writer is referred to as "reader/writer antenna". A reader/writer energizes an RFID tag and, simultaneously transmits/receives data to or from the RFID tag through their antennas by means of electromagnetic induction. As a result, a non-contact data transmission/reception between the RFID tag and the reader/writer is established.

Such RFID tags are attached to packages of food products and of industrial products for the purpose of controlling their production or distribution process. In addition, RFID tags are contained in cards, thereby constituting prepaid cards.

On the other hand, manufacturers of products equipped with an RFID tag need to inspect the functions of the RFID tags before and after the attachment to the products or their packages. Typically, this inspection is represented by a data communication test between an RFID tag and a reader/writer. An example of this test method is described in Japanese Unexamined Patent Application No. 2002-230510.

This test method makes it possible to determine whether or not RFID tags operate successfully, but does not yet determine the cause of the abnormalities of RFID tags if any abnormalities are detected. In other words, an abnormality of RFID tags is caused mainly by the failure of their IC chip, the contact failure between their IC chip and tag antenna, or the lack of the property of their tag antenna. However, with the above test method alone, which of these three causes cannot be identified.

An object of the present invention is to provide an RFID tag inspection system which inspects the properties of tag antennas, and further, which determines the communication performance of RFID tags, based on how much their resonant frequencies are shifted from a target value.

SUMMARY OF THE INVENTION

According to an aspect of the present invention, there is provided, an RFID tag inspection system for inspecting an RFID tag including a coiled tag antenna having a predetermined resonant frequency is constituted of:

(1) a reader/writer including a coiled reader/writer antenna, for transmitting/receiving data to or from the RFID tag at the resonant frequency through the reader/writer antenna;

(2) an RFID tag set portion on which the RFID tag is set in such a way that the tag antenna is located within a coverage area of the reader/writer antenna; and (3) a magnetic field sensing coil including at least one open terminal, the magnetic field sensing coil being placed corresponding to the tag antenna.

According to another aspect of the present invention, there is provided, an RFID tag inspection method for inspecting an RFID tag by using a reader/writer having a coiled reader/writer antenna and a magnetic field sensing coil having a plurality of open terminals, said method including:

(a) positioning the magnetic field sensing coil within a coverage area of the reader/writer antenna;

(b) setting the RFID tag to correspond to the magnetic field sensing coil;

(c) delivering an inspection signal from the reader/writer to the RFID tag; and (d) measuring a voltage between the open terminals.

In this inspection system, the RFID tag is set on the RFID tag set portion, the reader/writer then communicates with the RFID tag, and the voltage between the open terminals is finally measured during the communication. Consequently, it is possible to confirm whether or not the tag antenna has the resonant frequency faithfully to a design target.

Concretely, if the tag antenna resonates at the frequency of the magnetic field generated by the reader/writer antenna during the communication, then the magnetic field around the tag antenna is strengthened, thereby causing a great change in the magnetic field. Otherwise, if the resonant frequency of the tag antenna is greatly shifted from that of the reader/writer antenna, the resonance strength of the tag antenna is attenuated by this shift amount, so that the change in the magnetic field around the tag antenna is not so prominent.

In either case, this change in the magnetic field induces a voltage in the magnetic field sensing coil placed corresponding to the tag antenna. Accordingly, by measuring the voltage, current or electric power between the open terminals of the magnetic field sensing coil, whether or not the resonant frequency of the tag antenna matches with the design target can be confirmed.

In this inspection system, it is preferable that the RFID tag set portion is configured in such a way that a distance thereof with respect to the reader/writer antenna can be changed.

With this configuration, the strength of magnetic field applied to the RFID tag can be changed in accordance with specifications of the RFID tag.

In addition, the strength of the magnetic field generated from the reader/writer can be changed, so that the inspection is performed at a desired communication distance and under a magnetic field of desired strength.

Furthermore, it is preferable that the reader/writer includes a resonance signal output terminal through which a resonance signal is outputted, the resonance signal being produced by the reader/writer based on a load modulation signal received from the RFID tag through the reader/writer antenna, the load modulation signal being produced by the RFID tag in response to data received from the reader/writer.

Both the voltage between the open terminals and a resonance signal (amplitude) at the resonance signal output terminal are monitored, so that which side the resonant frequency of the tag antenna is shifted can be confirmed.

Specifically, the resonant frequency of tag antenna of the RFID tag is switched between two frequencies, depending on ON/OFF of the resistance of the IC in the RFID tag in order to realize a digital communication. The former frequency is targeted for the resonant frequency of the magnetic field generated from the reader/writer, whereas the latter frequency is slightly shifted from the former frequency.

The resonance signal acquires a maximum value when the RFID tag resonates at the resonant frequency of the reader/writer. This value is decreased if the resonant frequency of the RFID tag is shifted from that of the reader/writer. Hence, with the resonance intensity signal alone, which side the resonant frequency of the tag antenna is shifted cannot be confirmed.

In contrast, the voltage between the open terminals is monitored, mostly when the resonant frequency of the tag antenna is shifted from that of the reader/writer. Within an allowable range where the resonant frequency of the RFID tag is varied in a manufacturing process, the voltage between the open terminals is simply increased or decreased. Accordingly, it is possible to confirm which side the resonant frequency of the RFID tag is shifted, based on the level of the voltage between the open terminals.

Moreover, the RFID tag set portion is made of a non-magnetic or insulating material such as a resin, thereby achieving the accurate inspection without affecting the magnetic field.

BRIEF DESCRIPTION OF THE DRAWINGS

For more complete understanding of the present invention and the advantages hereof, reference is now made to the following description taken in conjunction with the accompanying drawings wherein.

DETAILED DESCRIPTION OF THE EXEMPLARY EMBODIMENTS OF THE INVENTION

Figure 1:
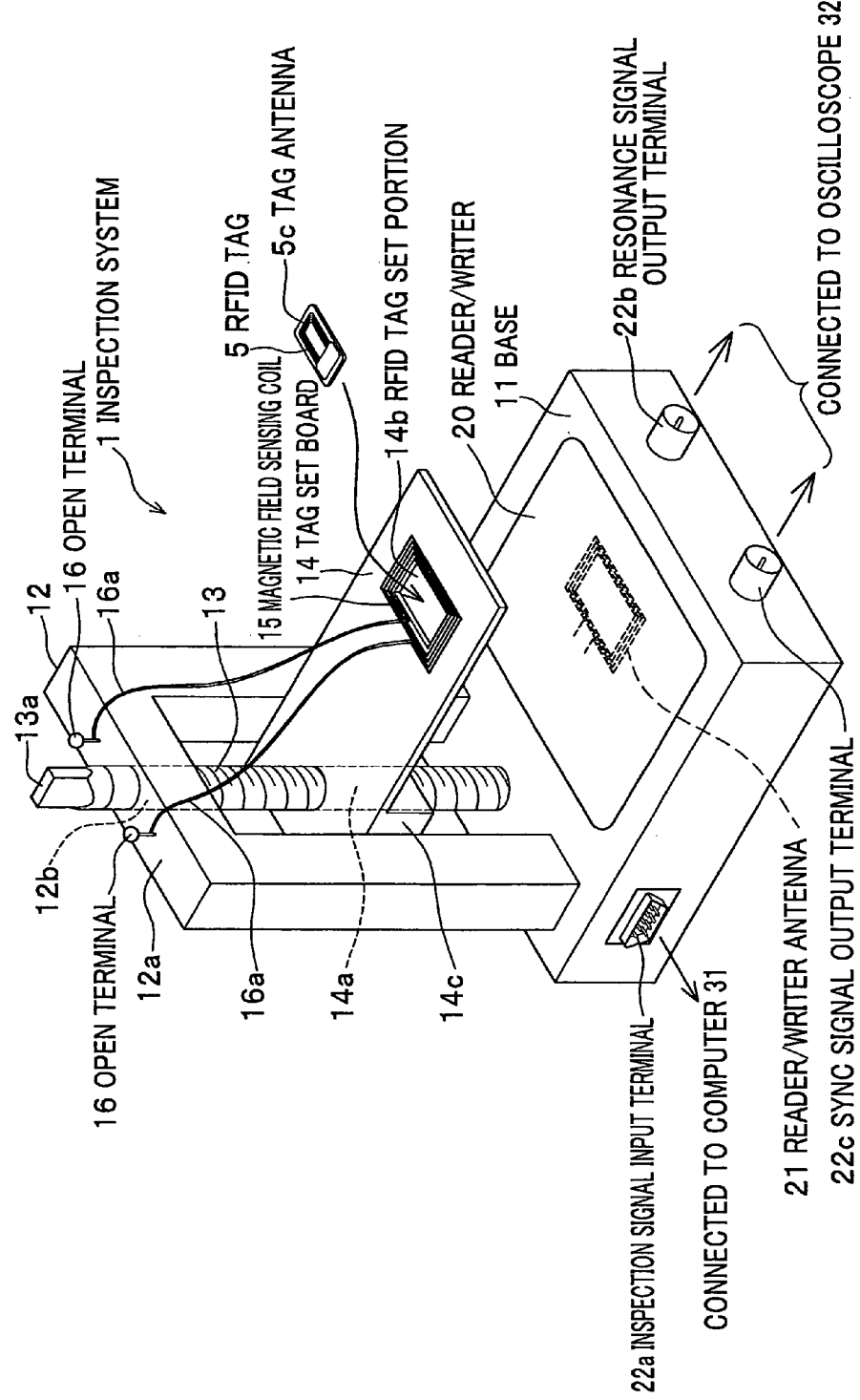
FIG. 1 is a perspective view depicting an RFID tag inspection system according to an embodiment of the present invention.
Figure 2:
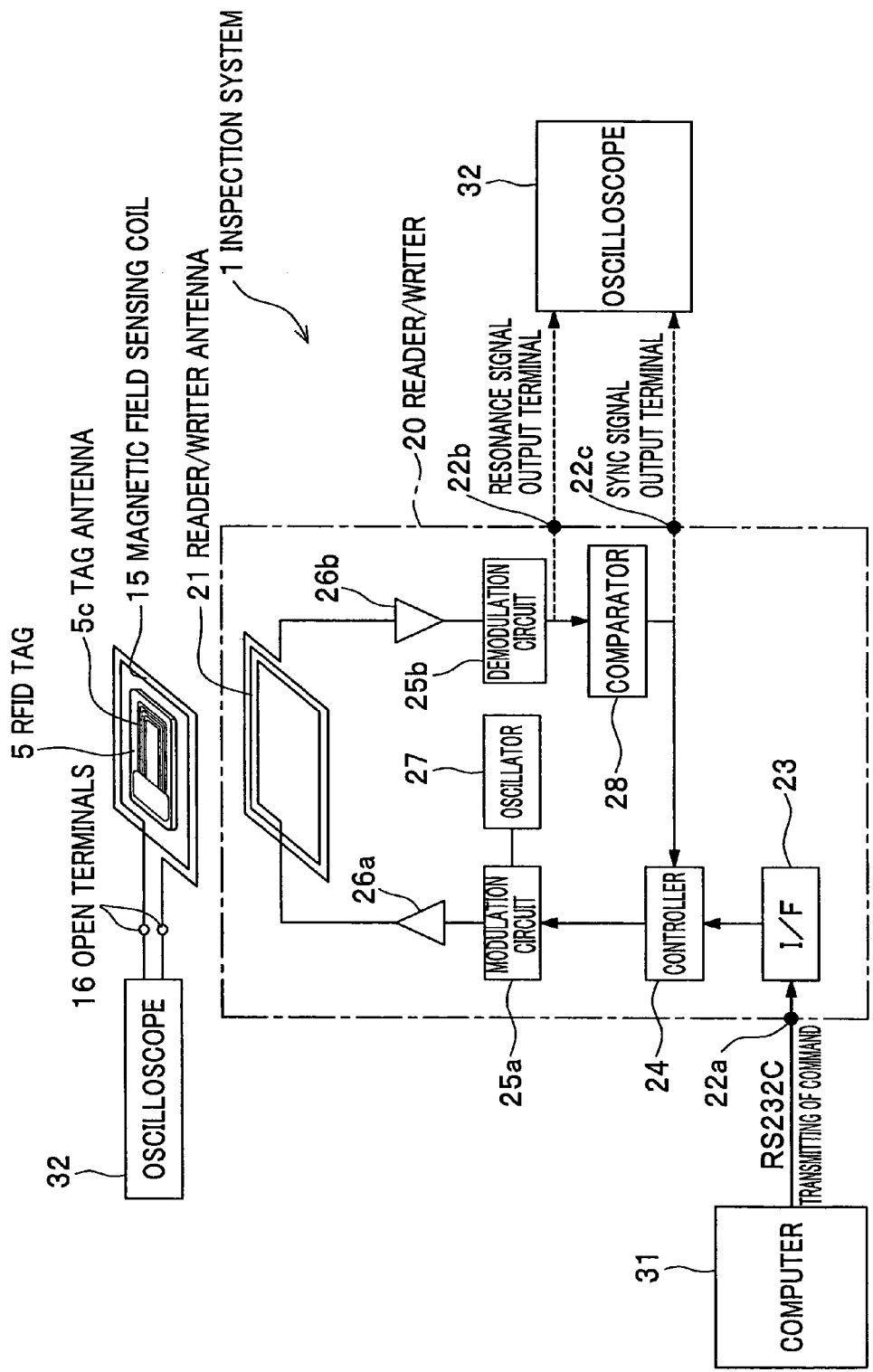
FIG. 2 is a block diagram of the inspection system.

A description will be given below in detail of an embodiment of the present invention, with reference to the accompanying drawings as appropriate. FIG. 1 is a perspective view depicting an RFID tag inspection system according to an embodiment of the present invention; FIG. 2 is a block diagram of the inspection system; and FIG. 3 is a plane view depicting an example of the RFID tag.

Referring to FIG. 1, an RFID tag inspection system 1 (hereinafter, referred to as "inspection system 1" for short) is constituted of, as main components:

(a) a tag set board 14 on which an RFID tag 5 (see FIG. 3) is to be set;
(b) a reader/writer 20 contained in the base 11, which is compatible with the RFID tag 5;
(c) a magnetic field sensing coil 15 disposed on the tag set board 14; and
(d) a pair of open terminals 16 which are electric contact points at both ends of the magnetic field sensing coil 15, respectively.

Figure 3:
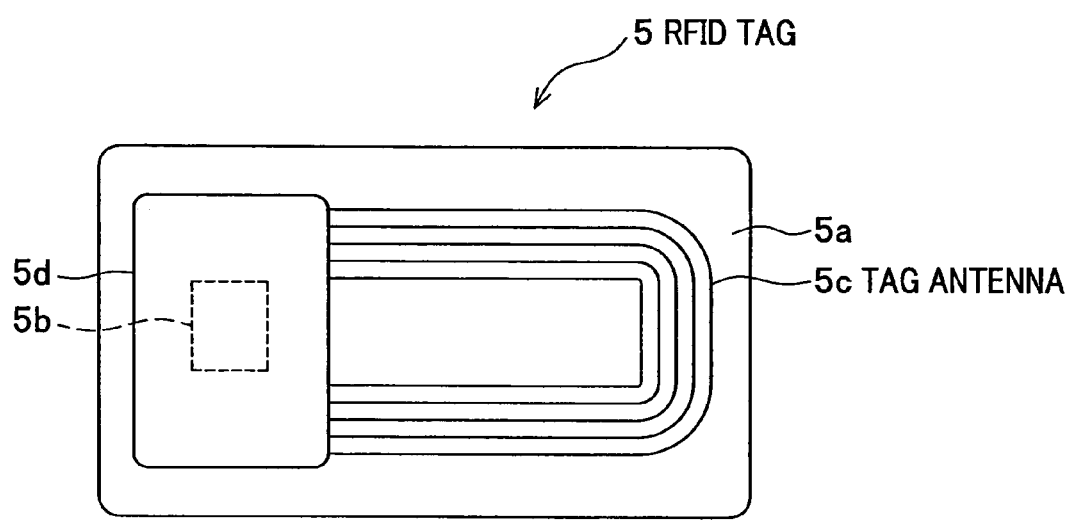
FIG. 3 is a plane view depicting a representative example of an RFID tag.

The RFID tag 5, being to be inspected by the inspection system 1, is shown in FIG. 3.

This RFID tag 5 is constituted of:

(i) a board 5a made of a non-metal such as a resin;
(ii) an IC chip 5b placed on the board 5a and incorporating a memory element and an optional operators; and
(iii) a coiled tag antenna 5c formed of a print wire and connected to the IC chip 5b. In addition, the IC chip 5b is protected by being coated by a resinous covering compound such as a globe top 5d.

The tag set board 14 is a resin-molded, plate-shaped member, as shown in FIG. 1. The portion near one short side of the tag set board 14 (the upper left side in FIG. 1) is formed thick, and has a screw hole 14a penetrating therethrough vertically in FIG. 1. In contrast, the portion near the other short side of the tag set board 14 is formed thin. On a top surface of this tag set board 14, the magnetic field sensing coil 15 formed of a printed or adhered metal wire is disposed. The magnetic field sensing coil 15 is provided with, on its inner side, a recess having just the right depth to accommodate the RFID tag 5, such as 0.5 mm depth. This recess serves as an RFID tag set portion 14b.

By this recess, the RFID tag 5 can be fixed at a predetermined location, thereby acquiring a stable inspection result of the RFID tag 5. In addition, the tag antenna 5c can be placed so as to be substantially flush with the magnetic field sensing coil 15. As a result, the resonant state of the tag antenna 5c can be confirmed exactly. If the magnetic field sensing coil 15 is positioned far away from the tag antenna 5c, then it is difficult for the magnetic field sensing coil 15 to sense the resonant state of the tag antenna 5c. In addition, if the magnetic field sensing coil 15 has a small diameter, a signal sensed by the magnetic field sensing coil 15 ends up being low. In consideration of these properties, the diameter of the magnetic field sensing coil 15 and the distance between the magnetic field sensing coil 15 and the tag antenna 5c need to be optimized. It is preferable that the magnetic field sensing coil 15 is positioned around the tag antenna 5c so as to be concentric with the tag antenna 5c. To give an example, the magnetic field sensing coil 15 may be formed on the bottom surface of the RFID tag set portion 14b, in accordance with the shape of the tag antenna 5c.

The tag set board 14 above is positioned in such a way that the magnetic field sensing coil 15 faces a reader/writer antenna 21 of the reader/writer 20. This results in positioning of the tag antenna 5c within a coverage area of the reader/writer antenna 21.

The base 11, which serves as a resin case containing the reader/writer 20, supports the tag set board 14 at a predetermined height. Near one short side of the base 11 (upper left in FIG. 1), an inverted U-shaped support member 12 made of a resin material is provided. The support member 12 has an upper beam 12a, and on a center of this upper beam 12a, a through hole 12b is formed vertically. Into this through hole 12b, an upper journal of a screwed shaft 13 made of a resin material is fitted, so that the upper beam 12a bears the screwed shaft 13. A lower end of the screwed shaft 13 is bore by the base 11, and at the upper end, a knob 13a is formed.

The tag set board 14 has a screw hole 14a into which the screwed shaft 13 is screwed, and the side surfaces 14c of the tag set board 14 are sandwiched between the inner surfaces of the support member 12. This arrangement allows the tag set board 14 to move vertically in contact with the inner surface of the support member 12, by turning the screwed shaft 13. Further, from the base 11, an inspection signal input terminal 22a, a resonance signal output terminal 22b, and a sync signal output terminal 22c are exposed, which are all described in detail later.

On the upper beam 12a, the open terminals 16 each serving as an electric contact point made of a metal are provided, and are connected to respective ends of the magnetic field sensing coil 15 through lead wires 16a.

Note that the reason why the base 11, the support member 12, the screwed shaft 13 and the tag set board 14 are all made of resin materials is to prevent them from affecting the magnetic fields generated by the reader/writer 20 and the RFID tag 5. Accordingly, it is preferable that the base 11, the support member 12, the screwed shaft 13 and the tag set board 14 are all made of non-magnetic or insulating materials.

Next, a description will be given below of an electric configuration of the inspection system 1 with reference to FIG. 2. The reader/writer 20 includes, as main components, an interface (I/F) 23, a controller 24, a modulation circuit 25a, a demodulation circuit 25b, a comparator 28, the inspection signal input terminal 22a, the resonance signal output terminal 22b and the sync signal output terminal 22c.

The inspection signal input terminal 22a is a terminal to which a computer 31 transmitting an inspection signal is connected. The inspection signal enters the controller 24 through the interface 23. In this case, the structure of the inspection signal input terminal 22a and the operation of the interface 23 are in compliance with the RS232C standard, for example.

The controller 24 interprets the inspection signal from the computer 31 to thereby acquire a command therefrom. Further, the controller 24 transmits this command to the RFID tag 5 by using the reader/writer antenna 21 through the modulation circuit 25a and the amplifier 26a. Examples of the command include a data write command and a data read command.

The modulation circuit 25a modulates the command into a signal format which the RFID tag 5 can receive. This modulation is done in compliance with a wireless communication scheme such as the ISO14443 standard. The signal generated by the modulation circuit 25a is amplified by the amplifier 26a, and is then delivered to the reader/writer antenna 21.

An oscillator 27 generates a carrier wave having a frequency of, for example, 13.56 MHz, which is used when the modulation circuit 25a performs the modulation.

A signal caught by the reader/writer antenna 21 is amplified by an amplifier 26b, and is then delivered to the demodulation circuit 25b. The demodulation circuit 25b demodulates the signal from the amplifier 26b into a signal format in compliance with the wireless communication scheme. The demodulated signal can be monitored through the resonance signal output terminal 22b, and is delivered to the comparator 28.

The comparator 28 converts the signal demodulated by the demodulation circuit 25b into a binary signal, based on its predetermined threshold. Specifically, if the demodulated signal exceeds the threshold, then the comparator 28 converts the signal into a predetermined voltage level. Otherwise, it converts the signal into 0V. Subsequently, this binary signal can be monitored through the sync signal output terminal 22c, and is delivered to the controller 24.

Both the resonance signal output terminal 22b and the sync signal output terminal 22c are connected to an oscilloscope 32, and the respective signals at these terminals can be monitored thereon. The open terminals 16 of the magnetic field sensing coil 15 are also connected to the oscilloscope 32, and a voltage produced by the magnetic field sensing coil 15 can be monitored thereon. Note that the level of this voltage is equivalent to the strength of the magnetic field generated from the magnetic field sensing coil 15.

A description will be given below of a method for using the inspection system 1 configured above and of an operation of the same, with reference to FIGS. 1 and 2. First, the computer 31 is connected to the inspection signal input terminal 22a in order to enter the inspection signal into the inspection system 1. The open terminals 16, the resonance signal output terminal 22b and the sync signal output terminal 22c are then connected to the oscilloscope 32.

Prior to setting of the RFID tag 5, the inspection signal containing a command, such as a magnetic field ON/OFF command, a data writing command and a data reading command, is entered into the inspection system 1. Subsequently, the height of the tag set board 14 is adjusted so that the magnetic field emitted from the reader/writer antenna 21 meets a predetermined inspection condition. For example, the height of the tag set board 14 is adjusted by turning the knob 13a while the voltage between the open terminals 16 is monitored, so that the magnetic field strength on the location where the magnetic field sensing coil 15 is placed is 5 A/m.

The RFID tag 5 is set on the RFID tag set portion 14b. Subsequently, when the inspection signal from the computer 31 is entered into the inspection system 1, the controller 24 interprets this inspection signal to thereby acquire a command, and the command is then propagated to the RFID tag 5 by the reader/writer antenna 21 through the modulation circuit 25a and the amplifier 26a. In this embodiment, assuming that the frequency of the inspection signal is 13.56 MHz in compliance with the ISO14443 standard. In this case, the tag antenna 5c (see FIG. 3) of the RFID tag 5 is designed to resonate with the change in the magnetic field at 13.56 MHz. Therefore, if this RFID tag 5 has been produced faithfully to this design, then the RFID tag 5 greatly resonates, thereby strengthening the magnetic field around the RFID tag 5. Otherwise, if the RFID tag 5 has not due to a variation in the thickness, etc., then the resonant frequency of the RFID tag 5 is shifted from 13.56 MHz, and the RFID tag 5 thus decreases the strength of the magnetic field around the RFID tag 5 by this shift amount.

Figure 4:
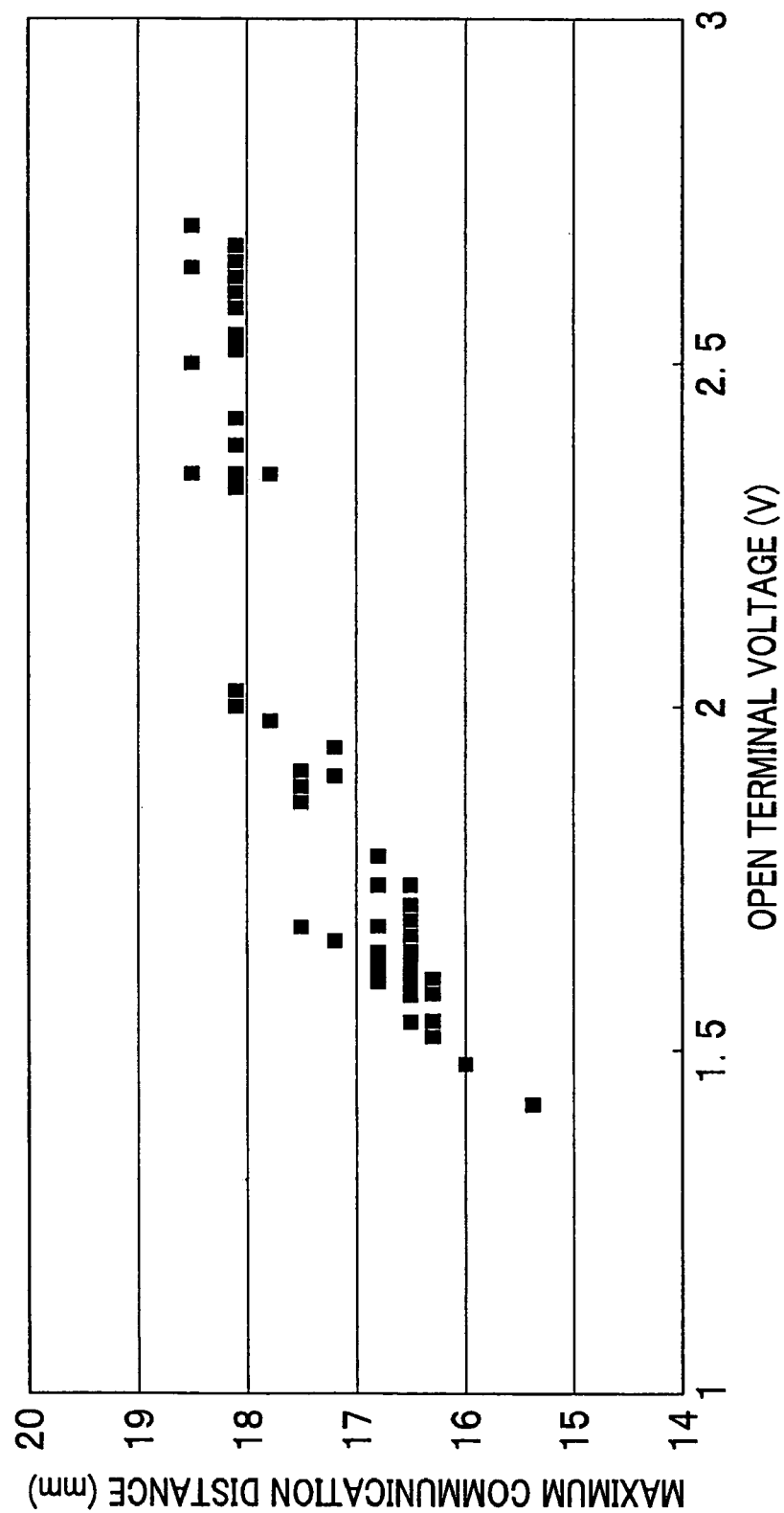
FIG. 4 is a graph showing a relationship between an open terminal voltage and a maximum communication distance of the RFID tag.

By using the multiple RFID tags 5 as samples, the voltages between the open terminals 16 (hereinafter, referred to as "open terminal voltage") were measured, and these results were shown in FIG. 4. FIG. 4 is a graph showing a relationship between the open terminal voltage and a maximum communication distance of the RFID tags 5. A horizontal axis of this graph is denoted by the open terminal voltage under the condition that the external magnetic field is 5 A/m. A vertical axis thereof is denoted by the maximum communication distance when the height of the tag set board 14 is changed. Referring to FIG. 4, the respective open terminal voltages of the samples were distributed over a range from 1.4V to 2.7V, and it can be found that the maximum communication distances extended in proportion to the open terminal voltages. To give some examples, when the open terminal voltage was as low as 1.4V, the maximum communication distance was as short as 15.4 mm. In comparison, when the open terminal voltage was as high as 2.7V, the maximum communication distance was as long as 18.5 mm.

In this way, by monitoring the open terminal voltage on the oscilloscope 32, it can be confirmed whether or not the resonant frequency of the RFID tag 5 meets the design requirement.

In addition, merely by monitoring the resonance signal alone, which side the resonant frequency of the RFID tag 5 is shifted cannot be confirmed. However, by monitoring the open terminal voltage in addition to the resonance signal, the shifted side can be confirmed.

Next, the resonance signal will be described below with reference to FIG. 5.

Figure 5:
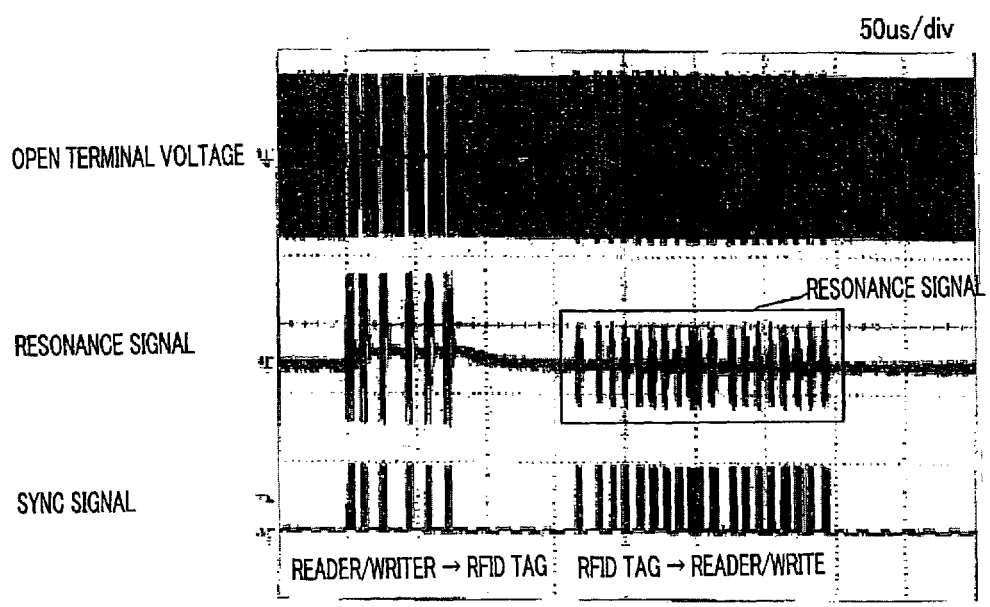
FIG. 5 is a screen of an oscilloscope, on which the open terminal voltage, a signal at a resonance signal output terminal, and a signal at a sync signal output terminal are displayed.

FIG. 5 is a screen of an oscilloscope, on which the open terminal voltage, a signal at the resonance signal output terminal, and a signal at the sync signal output terminal are displayed. Hereinafter, the signal at the resonance signal output terminal is referred to as "resonance signal", and the signal at the sync signal output terminal is referred to as "sync signal". In FIG. 5, top, middle and bottom waveforms correspond to the open terminal voltage, the resonance signal and the sync signal, respectively.

As for the top waveform, that is, the open terminal voltage, as its level (amplitude) is increased, the resonant frequency of the RFID tag 5 being inspected is approaching 13.56 MHz.

As for the middle waveform, that is, the resonance signal, it is a waveform of the signal fed to the reader/writer antenna 21, and is for monitoring the resonant state of the RFID tag 5. The left portion of this waveform is a waveform indicating the state where the reader/writer 20 transmits the signal to the RFID tag 5, and the right portion is a waveform indicating the state where the reader/writer 20 receives the signal from the RFID tag 5.

The RFID tag 5 is designed to change the frequency of the signal to be emitted, between 13.56 MHz and a frequency slightly shift from 13.56 MHz, depending switching of its internal resistance. If the resonant frequency of the tag antenna 5c is shifted from a desired value toward high or low frequency side, then the strength (amplitude) of the signal which is generated from the RFID tag 5, that is, which is received by the reader/writer antenna 21 is decreased.

A description will be given below of a specific method for confirming which side the resonant frequency is shifted, with reference to FIG. 6. In this case, assuming that the RFID tag 5 emits the signal at a target frequency, i.e. 13.56 MHz, when its internal resistance is switched ON, whereas the RFID tag 5 emits the signal at a frequency slightly lower than the target frequency, when its internal resistance is switched OFF.

Figure 6A:
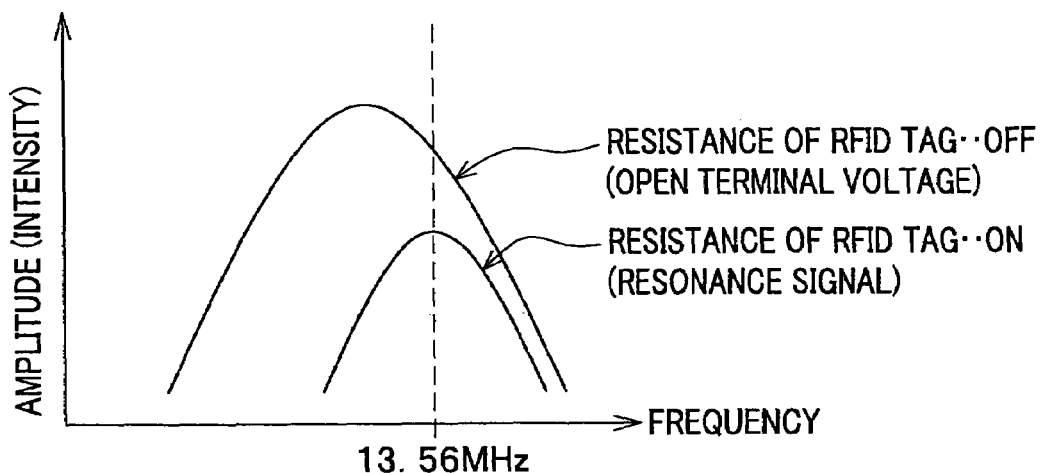
FIG. 6A is a graph showing one example of a relationship between a frequency and both a resonance signal and the open terminal voltage, on the condition that a resonant frequency of an RFID tag antenna is a target value.
Figure 6B:
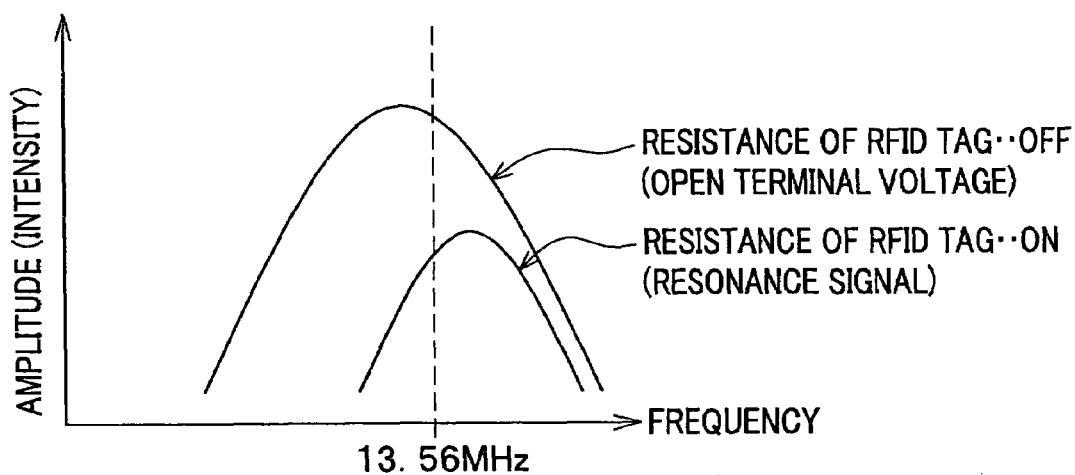
FIG. 6B is a graph showing one example of the relationship between the frequency and both the resonance signal and the open terminal voltage, on the condition that the resonant frequency of the RFID tag antenna is shifted from the target value toward the high frequency side.
Figure 6C:
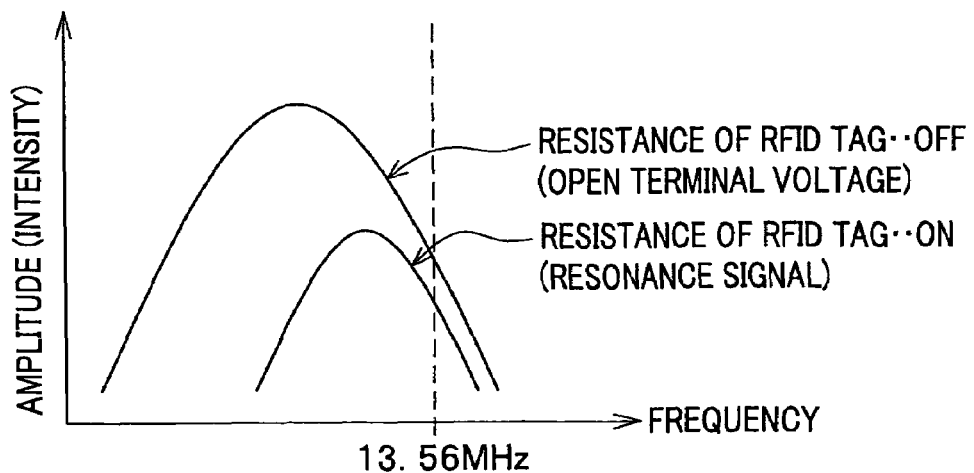
FIG. 6C is a graph showing one example of the relationship between the frequency and both the resonance signal and the open terminal voltage, on the condition that the resonant frequency of the RFID tag antenna is shifted from the target value toward the low frequency side.

FIGS. 6A to 6C are graphs showing an illustrative relationship between the frequency of the signal generated by the RFID tag 5 and both the amplitude of the resonance signal and the open terminal voltage. FIG. 6A shows the relationship under the condition that the resonant frequency of the tag antenna is of the target value, FIG. 6B shows the relationship under the condition that the resonant frequency is shifted toward the high frequency side, and FIG. 6C shows the relationship when the frequency is shifted toward the low frequency side.

Referring to FIG. 6A, when the internal resistance of the IC is switched ON, the resonance signal acquires the highest amplitude at 13.56 MHz. In addition, when the resistance of the IC of the RFID tag 5 is switched OFF, the open terminal voltage acquires the maximum amplitude at a frequency slightly lower than 13.56 MHz.

Referring to FIG. 6B, the resonance signal is decreased at 13.56 MHz because its resonance frequency is shifted from 13.56 MHz, whereas the open terminal voltage is increased at 13.56 MHz because the resonance frequency approaches 13.56 MHz.

Referring to FIG. 6C, the resonance signal is decreased at 13.56 MHz, whereas the open terminal voltage is also decreased at 13.56 MHz.

As described above, the resonance signal is merely attenuated when the resonant frequency is shifted from the target value toward high or low frequency side. Hence, even if only this resonance strength signal is monitored, which side the resonant frequency of the tag antenna is shifted cannot be determined.

However, both the open terminal voltage and the resonance signal are monitored in combination, so that which side the resonant frequency is shifted can be confirmed. This is because the open terminal voltage is increased when the resonant frequency of the tag antenna is shifted toward the high frequency side, whereas the open terminal voltage is decreased when the resonant frequency is shifted toward low frequency side.

Turning back to FIG. 5, a bottom waveform of this screen, that is, the sync signal is emitted in synchronization with the timing when the reader/writer 20 transmits the signal to the RFID tag 5, or when the RFID tag 5 transmits the signal to the reader/writer 20. It is thus considered that this sync signal shows the timing when to monitor the open terminal voltage and the resonance signal. Consequently, the sync signal can be used, for example, to process the open terminal voltage and the resonance signal with the computer.

In conclusion, with the inspection system 1 according to this embodiment, the resonant frequency of the RFID tag 5 can be confirmed with high accuracy, based on the level of the voltage produced from the magnetic field sensing coil 15 of the tag set board 14.

In addition, with the system, which side and how much the open terminal voltage is shifted from a desired value can be confirmed. Accordingly, both the shifted side and the shift amount of the resonant frequency of the RFID tag 5 can be determined.

Furthermore, the height of the tag set board 14 relative to the reader/writer antenna 21 is changed, so that the inspection can be done under a desired magnetic field. Further, since the communication test is done while the height is changed, the maximum communication distance can be determined.

Up to this point, the description has been given of the inspection system according to the embodiment of the present invention, but an inspection system according to the present invention is not limited to this embodiment, and can be modified and varied as appropriate. To give an example, the RFID tag 5 is placed on the RFID tag set portion 14b, but they do not face each other vertically. Alternatively, they may face horizontally, and the RFID tag 5 may be supported in the insert manner near the magnetic field sensing coil 15.

The tag set board 14 may be supported in any given manner, as long as the tag antenna 5c faces the reader/writer antenna 21. For example, the tag set board 14 may be supported by a support member other than the base 11.

In the embodiment above, the RFID tag 5 in which the IC chip 5b is mounted on the board has been exemplified, but a card type RFID tag, such as an IC card, is also applicable.

In the inspection system 1 according to the embodiment above, the vertical movement of the tag set board 14 and the measurement of both the open terminal voltage and the resonance signal have been done manually, but they can be done automatically instead.

To give an example, the tag set board 14 may be moved by an actuator in order to adjust the magnetic field to a desired value, and the measurement may be done through a computer.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An RFID tag inspection system for inspecting an RFID tag including a coiled tag antenna having a predetermined resonant frequency, said RFID tag inspection system comprising:
    a reader/writer including a coiled reader/writer antenna, for transmitting/receiving data to or from the RFID tag at the resonant frequency through the reader/writer antenna;
    an RFID tag set portion on which the RFID tag is set in such a way that the tag antenna is located within a coverage area of the reader/writer antenna; and
    a magnetic field sensing coil including a plurality of open terminals, the magnetic field sensing coil being placed corresponding to the tag antenna.

2. The RFID tag inspection system according to claim 1, wherein the RFID tag set portion is configured in such a way that a distance thereof with respect to the reader/writer antenna can be changed.

3. The RFID tag inspection system according to claim 2, wherein the reader/writer includes a resonance signal output terminal through which a resonance signal is outputted, the resonance signal being produced by the reader/writer based on a load modulation signal received from the RFID tag through the reader/writer antenna, the load modulation signal being produced by the RFID tag in response to data received from the reader/writer.

4. The RFID tag inspection system according to claim 3, wherein strength of a magnetic field generated by the reader/writer can be changed.

5. The RFID tag inspection system according to claim 4, wherein the RFID tag set portion is made of a non-magnetic material.

6. The RFID tag inspection system according to claim 5, wherein the RFID tag set portion is made of an insulating material.

7. The RFID tag inspection system according to claim 6, wherein the RFID tag set portion has a recess into where the RFID tag is set.

8. The RFID tag inspection system according to claim 7, wherein the magnetic field sensing coil is positioned around the RFID tag set portion so as to be concentric with the tag antenna.

9. The RFID tag inspection system according to claim 7, wherein the magnetic field sensing coil is positioned on a bottom of the RFID tag set portion so as to be concentric with the tag antenna.

10. The RFID tag inspection system according to claim 7, wherein the magnetic field sensing coil is positioned to be flush with the tag antenna.

11. The RFID tag inspection system according to claim 2, wherein strength of a magnetic field generated by the reader/writer can be changed.

12. The RFID tag inspection system according to claim 1, wherein the reader/writer includes a resonance signal output terminal through which a resonance signal is outputted, the resonance signal being produced by the reader/writer based on a load modulation signal received from the RFID tag through the reader/writer antenna, the load modulation signal being produced by the RFID tag in response to data received from the reader/writer.

13. The RFID tag inspection system according to claim 1, wherein strength of a magnetic field generated by the reader/writer can be changed.

14. The RFID tag inspection system according to claim 1, wherein the RFID tag set portion is made of a non-magnetic material.

15. The RFID tag inspection system according to claim 1, wherein the RFID tag set portion is made of an insulating material.

16. The RFID tag inspection system according to claim 1, wherein the RFID tag set portion has a recess into where the RFID tag is set.

17. The RFID tag inspection system according to claim 1, wherein the magnetic field sensing coil is positioned around the RFID tag set portion so as to be concentric with the tag antenna.

18. The RFID tag inspection system according to claim 1, wherein the magnetic field sensing coil is positioned on a bottom of the RFID tag set portion so as to be concentric with the tag antenna.

19. The RFID tag inspection system according to claim 1, wherein the magnetic field sensing coil is positioned to be flush with the tag antenna.

20. An RFID tag inspection method for inspecting an RFID tag by using a reader/writer having a coiled reader/writer antenna and a magnetic field sensing coil having a plurality of open terminals, said method comprising:
    positioning the magnetic field sensing coil within a coverage area of the reader/writer antenna;
    setting the RFID tag to correspond to the magnetic field sensing coil;
    delivering an inspection signal from the reader/writer to the RFID tag; and
    measuring a voltage between the open terminals.

* * * * *